United States Patent [19]
Fredericks et al.

[11] Patent Number: 4,745,045
[45] Date of Patent: May 17, 1988

[54] METHOD FOR IMPROVING RESOLUTION IN MICROELECTRONIC CIRCUITS USING PHOTORESIST OVERLAYER BY USING THERMALLY PROCESSED POLYIMIDE UNDERLAYER FORMED FROM POSITIVE PHOTORESIST AND POLYAMIC ACID

[75] Inventors: Edward C. Fredericks, Manassas; Giorgio G. Via, McLean, both of Va.

[73] Assignee: International Business Machines Corporation, Armonk, N.Y.

[21] Appl. No.: 928,746

[22] Filed: Nov. 10, 1986

Related U.S. Application Data

[63] Continuation-in-part of Ser. No. 710,746, Mar. 11, 1985, abandoned.

[51] Int. Cl.⁴ .................. G03F 7/20; H01L 21/283
[52] U.S. Cl. ................................. 430/315; 430/166; 430/189; 430/191; 430/192; 430/193; 430/311; 430/312; 430/313; 430/314; 430/317; 430/324; 430/330; 156/643; 156/646
[58] Field of Search .............. 430/311, 312, 315, 326, 430/328, 330, 319, 313; 156/643, 646

[56] References Cited

U.S. PATENT DOCUMENTS

| 3,873,313 | 3/1975 | Horst et al. | 430/312 |
|---|---|---|---|
| 4,093,461 | 6/1978 | Loprest et al. | 430/330 |
| 4,102,683 | 7/1978 | DiPiazza | 430/319 |
| 4,229,879 | 10/1980 | Lindebrings et al. | 430/312 |
| 4,370,405 | 1/1983 | O'Toole et al. | 430/312 |
| 4,427,713 | 1/1984 | White et al. | 430/330 |
| 4,470,871 | 9/1984 | White et al. | 156/646 |
| 4,563,241 | 1/1986 | Tanaka et al. | 430/313 |

OTHER PUBLICATIONS

Khoury et al., *IBM Technical Disclosure Bulletin*, vol. 13, No. 1, 6/1970, p. 38.

Primary Examiner—Charles L. Bowers, Jr.
Attorney, Agent, or Firm—Jesse L. Abzug

[57] ABSTRACT

A method which provides for a permanent planarization layer on a multilayer integrated circuit. The planarization layer resides above other circuit layers which reflect incident light. A layer of photoresist is formed over the planarization layers and imaged through a mask with circuit defining structure. During exposure of the photoresist, incident light passes through the planarization layer. Scattering from the boundary of the planarization layer and photoresist is minimized because the index of refraction of the planarization layer is substantially equal to the index of refraction of the photoresist. Light reflected from the underlaying layers is substantially absorbed by the planarization layer. Reduction of the reflected and scattered light results in improved resolution of developed images in photoresist. The developed images, when further processed into interconnecting conductors have improved definition, avoiding the additional process steps of applying a temporary dye or other light impervious layer.

1 Claim, 2 Drawing Sheets

ADDITIVE METAL DEPOSITION PROCESS

METHOD FOR IMPROVING RESOLUTION IN MICROELECTRONIC CIRCUITS USING PHOTORESIST OVERLAYER BY USING THERMALLY PROCESSED POLYIMIDE UNDERLAYER FORMED FROM POSITIVE PHOTORESIST AND POLYAMIC ACID

This application is a continuation-in-part of application Ser. No. 710,746, filed Mar. 11, 1985, now abandoned.

The present invention relates to processes for manufacturing microelectronic semiconductor devices. Specifically, a method and composition of matter are described for improving, during the manufacture of semiconductor integrated circuits, the line resolution of circuit conductors.

Microelectronic circuit techniques have been developed which permit a high density electronic circuit to be incorporated in an integrated circuit. These techniques utilize a photo etching process wherein layers of circuit elements are provided on a substrate. The technology for manufacturing integrated circuits in accordance with these techniques has progressed to the point where submicron geometrics are possible, permitting increased circuit density for a given substrate area.

The high density integrated circuits are multi-layer structures which include layers of metallization which interconnect different components of a given layer on a substrate. The interconnecting metal deposits are formed by both subtractive and additive metal deposition techniques.

In an additive deposition technique, photoresist is applied to a surface of a substrate. A first layer of conductor elements are patterned on a photoresist material. The photoresist material is exposed through an image mask, such that certain areas of the resist are exposed to light, and other areas are masked from light. The exposed areas are subsequently removed, leaving mesas of photoresist interspaced by the areas formerly occupied by exposed photoresist material. A subsequent metallization of the processed surface provides for metal deposits which lie between the mesas in the areas formerly occupied by the exposed photoresist. The mesas, with the accompanying deposited metal, are subsequently removed. An insulation layer is deposited over the remaining metallic layers, and yet another layer of metallization may be formed on the resulting planarization layer.

The various techniques for manufacturing multilayer integrated circuits which utilize photoresist processes for defining the geometry of subsequent metallized surfaces are subject to resolution limitations. As each additional layer is formed on the multilevel integrated circuit, a subsequent layer of photoresist is patterned and exposed by an image mask. The exposed resist areas transmit a portion of light to the underlayer insulation which separates the metal layers and refracts another portion upwards at the boundary of the insulation and photoresist. The light transmitted through the exposed photoresist layer passes through the substrate and is reflected from the undersurface which may be a highly reflective layer of metal deposition. As such, the developed pattern of conductors for the upper levels of a multilayer integrated circuit suffer from the effects of scattered light from the photoresist/insulator boundary layer, as well as reflected light from the underlayers. The scattered and reflected light diminishes the resolution of the conductive layers formed over these surface layers. Such limitations in resolution inhiit the manufacture of integrated circuits of increased density.

Two techniques for avoiding thses process limitations are described in U.S. Pat. Nos. 4,370,405 and 4,362,809. In U.S. Pat. No. 4,370,405, a suitable dye is interposed between a layer of resist and planarizing layer to absorb light which is transmitted through the photoresist. In U.S. Pat. No. 4,362,809, a similar dye is utilized which is selected to absorb light of a wavelength used to expose the rop resist layer but permits light to enter at another wavelength to expose a bottom resist layer. Wavelengths of light used to expose the top layer are absorbed in the dye. During exposure of a bottom layer, the light of a different wavelength is permitted to pass through the bottom resist layer and dye.

The present invention provides yet another technique for reducing the effects of underlayer reflections on upper photoresist layers in processes for manufacturing multilevel integrated circuits.

SUMMARY OF THE INVENTION

It is an object of this invention to improve the definition of interconnecting structures in an integrated circuit.

It is another object of this invention to reduce the effects of light scattering and reflections from under layers on subsequent surface circuit layers in a multilayer integrated circuit.

It is a more specific object of this invention to provide a permanent planarization layer of insulating material between conductor layers in a multilayer integrated circuit which reduces light scattering, with an adjacent upper layer and absorbe reflected light from the bottom layer.

These and other objects are provided by an insulation composition and method for making the composition according to the invention. The insulation composition is permanent, not requiring removal during integrated circuit manufacture. The method of the invention produces a planarization layer of said insulation composition which reduces boundary interface scattering with an upper photoresist layer, as well as absorbing light reflections from under layers.

The insulation composition according to the invention includes a polymer of the chemical reaction of pyromellitic anhydride and a base. Added to this material is a quantity of a photo active compound to reduce the index of refraction of the mixture to more closely match the index of refraction of the subsequently formed layer of photoresist.

The method in accordance with the invention provides for a permanent planarization layer on a multilayer integrated circuit. The planarization layer resides above other circuit layers which reflect incident light. A layer of photoresist is formed over the planarization layers. Circuit defining structure is imaged through the mask onto the photoresist. During exposure of the photoresist, incident light passes through the planarization layer. Scattering from the boundary of the planarization layer and photoresist is minimized because the index of refraction of the planarization layer is substantially equal to the index of refraction of the photoresist. Light reflected from the underlying layers is substantially absorbed by the planarization layer. Reduction of the reflected and scattered light results in improved resolution of developed images in photoresist. The developed images, when further processed into interconnecting conductors have improved definition, avoiding the additinal process steps of applying a temporary dye or other light impervious layer.

DESCRIPTION OF THE PREFERRED EMBODIMENT

Figure 1:
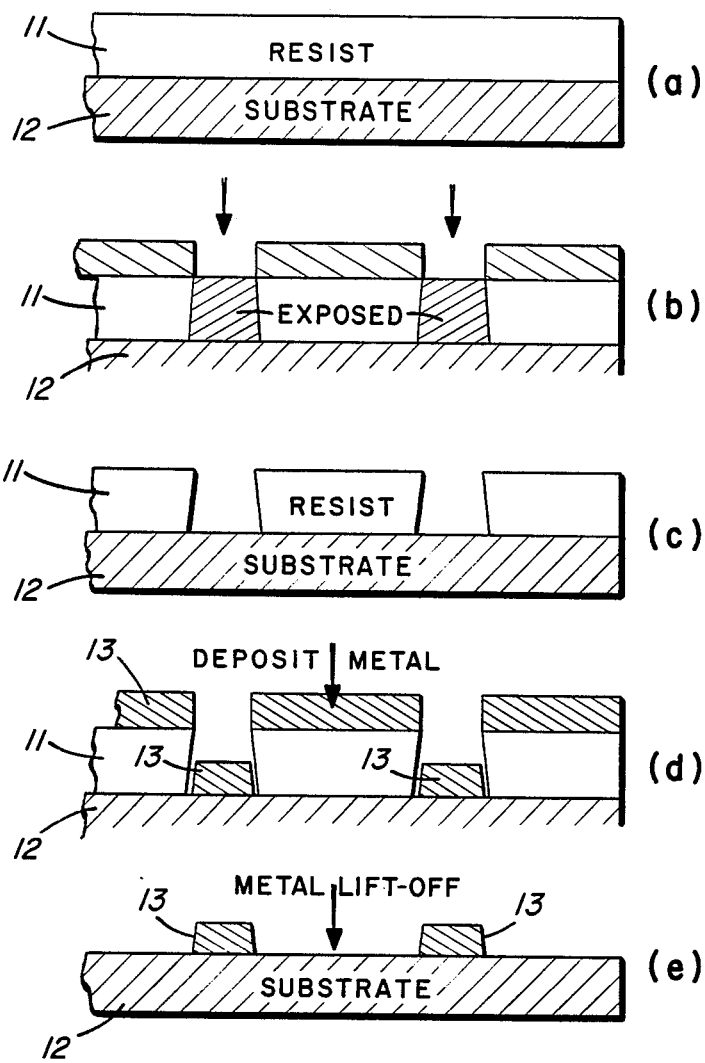
FIG. 1 illustrates the steps in forming, through one type of additive metal deposition process, interconnecting metallic conductors.

Referring now to FIG. 1, there is shown a set of process sequences A through E forming through an additive metal deposition process a first metallization layer on an integrated circuit substrate. The first of the steps, step (a), is shown to include coating a substrate 12 with a photoresist material 11 in a 1–3 micron thickness. The photoresist 11 is subsequently exposed to a mask image. The mask image provides for exposure of certain areas of the photoresist, identifying surface areas to be removed, and an unexposed portion which will not be removed. Process step (b), shown in FIG. 1, illustrates the exposed and unexposed areas of the resist 11. The substrate is then baked before removing the exposed areas.

Process step (c) provides for removal of the exposed resist material by first flooding it with ultraviolet light. Once those areas are exposed to ultraviolet light, they become soluble. Once treated with a solvent they are dissolved. A metal deposition on the substrate is effected in process step (d). Process step (d) will provide for metallization in those areas formerly occupied by the exposed photoresist, as well as the surface of the unexposed resist 13 shown as upstanding mesas. The metallization may be applied through vacuum sputtering techniques to a thickness of 0.5 microns to 2.0 microns.

As a final step (e) in the additive metal deposition process of FIG. 1, the remaining mesas and deposited metal are removed in a known metal lift-off technique. This lift-off technique utilizes hot solvents to remove the metallized mesas.

Figure 2:
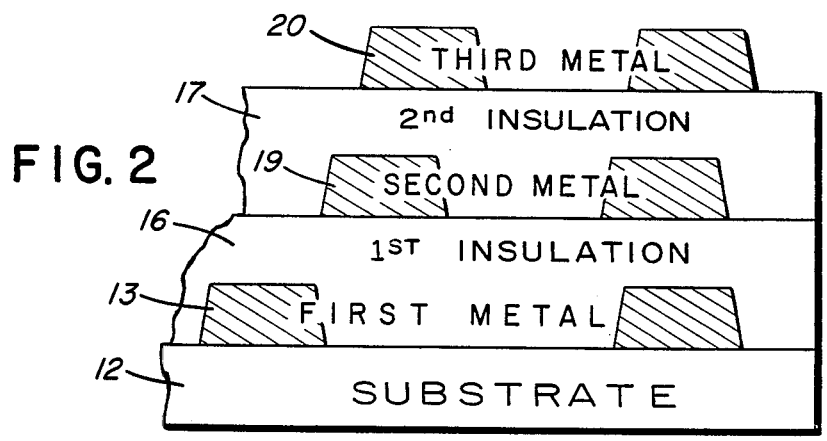
FIG. 2 is a cross-section of a multilevel integrated circuit illustrating three separate metal conducting layers.

Additional conductive layers may be formed over the first formed metallic layer to achieve a multi-layer structure as shown in FIG. 2. Insulating layers 16 and 17 are deposited over metallic layers 13 and 19, respectively, to prevent undesired metal contacts. The effects of surface boundary scattering and underlayer reflections, in forming the second and third metallization layers 19 and 20, are shown more particularly with reference to FIGS. 3 and 4.

Figure 3:
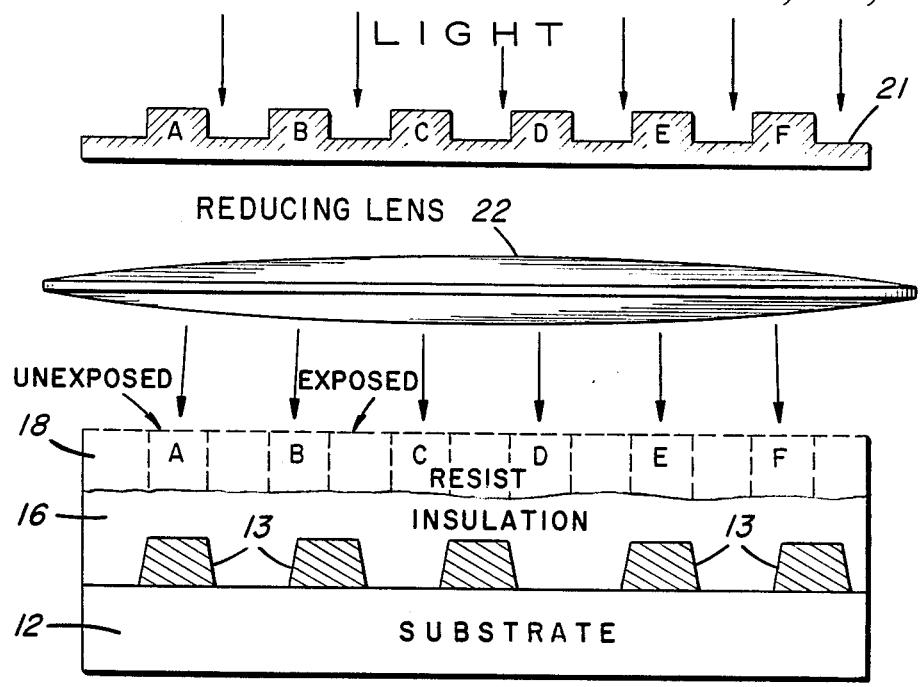
FIG. 3 illustrates the photoresist process used in forming the second metallization layer of FIG. 2.
Figure 4:
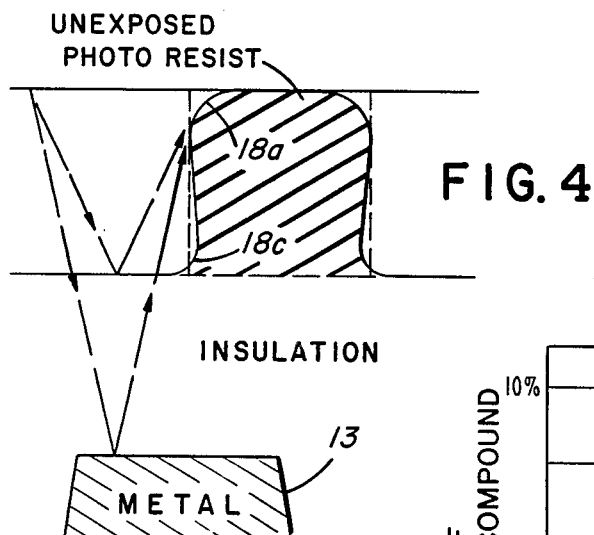
FIG. 4 illustrates the effects of underlayer reflections and boundary scattering on unexposed portions of a mask imaged on a photoresist layer.

Referring now to FIGS. 3 and 4, there is shown substrate 12 and the first metallization layer 13. A layer of insulation material 16, forming a planarization layer over the first metallization layer 13, supports a photoresist layer 18. The photoresist layer 18 is exposed with an image, formed from a mask 21 through a reducing lens 22. The result of exposing photoresist material 18 is shown in FIG. 4. Each of the rays which travel through the exposed areas of the photoresist 18 can be seen to include a scattered component as well as a transmitted component, as shown in FIG. 4. The transmitted component is incident to the underlayer of the first metallization layer, and is reflected back towards the photoresist layer 18. A consequence of the reflected ray and scattered ray is to expose the regions of the photoresist layer 18, which are masked. This unintentional exposure of the masked regions of the photoresist layer 18 is a reduction in definition of the unexposed area of the photoresist layer 18. As the definition of the unexposed photoresist area ultimately determines the conductor line width definition, the scattered and reflected light limits the conductor resolution possible with the photo etching techniques. These effects can be seen as round corners 18a and 18c in the formed mesas.

The present invention provides for an insulation layer which reduces the scattered and reflected components. The insulation composition, in accordance with the present invention, provides for an index of refraction approaching that of the upper photoresist layer, such that scattered light from the boundary of the insulation and photoresist is reduced. Further, the material has absorptive properties, which reduce the amount of reflected light ultimately re-entering the photoresist layer 18.

The insulation composition of the present invention comprises a polyimide. The polyimide material is a polymer mixture of the chemical reaction of pyromellitic anhydride and a base. Polyimic acid which is available from DuPont may be heated to produce a polyimide. Other suppliers of the polyimide material, useful for forming a major ingredient of the insulation material, includes Ciba Geigy or Upjohn. The material is sold under the designation polyimide.

Figure 5:
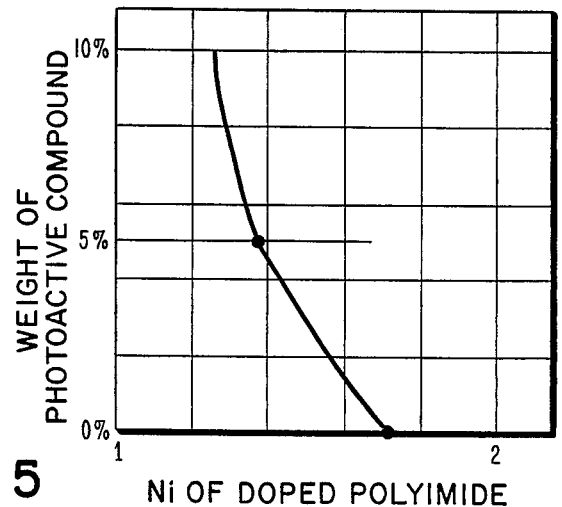
FIG. 5 illustrates the effect of doping polyimide compounds with a photoactive compound on the index of refraction of the doped compounds.

The polyimide material is doped with a material which will provide for a resulting index of refraction approaching that of the upper photoresist layer. The doping of the polyimide, in accordance with the preferred embodiment, comprises adding a photoresist material containing a photoactive compound to the polyimide in a proportion such that the concentration of the photoactive compound in the resulting mixture of polyimide and photoresist is approximately 1%, but preferably less than 2% by weight. Shown in FIG. 5 is a graph of the index of refraction of the resulting material as a function of the per cent by weight of photoactive compound added to the polymide planarization layer.

The photoresist material used in the preferred embodiment is a positive diazo novolak photoresist, one type of which is commercially available under the name AZ1350J, a registered trademark of American Hoechst Corporation. This photoresist is comprised of approximately 20% by weight photoactive compound, with the remainging constituents being a novolak resin and various solvents and additives. While the entire photoresist material was used in this preferred embodiment, it is the photoactive compound that makes this invention operable. Therefore, it would be obvious to one skilled in the art that the photoactive compound, without the novolak resin and solvents, could be mixed with the polyimide in an alternate embodiment.

The main class of photoactive compounds, which may be selected for mixture with the polyimides, are the diazo-oxo napthalenes. Preferably, the photoactive compound is a 2-diazo-1 oxo napthalene, or a 1-diazo-2 oxo napthalene, which may contain a sulfonic acid group or an ester of sulfonic acid at the 4 or 5 positions on the napthalene ring. The photoactive compounds are mixed in proportions larger than naturally occurring impurities. Such photoactive compounds are available from the Aldrich Chemical Company, or Eastman Chemical Company, under the aforementioned designation. Preferably, the 2-diazo-1 oxo napthalene sulfonic acid is an ester of an ethylene glycol having the chemical formula

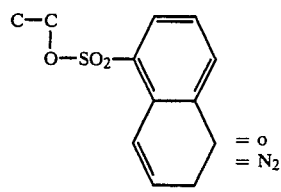

Generally, the diazo-oxo napthalenes are added to esterify an acid molecule. Preferably, the acid molecule contains a moity based on benzene, or a polyaromatic molecule such as napthalene, phenanthrene, pyrrone and banzophenone. A commercially available dye such as alizarin yellow A from Ciba Geigy can serve as the base carrier molecule to which the diazo-oxo napthalenes are chemically bonded in stoichiometric quantities.

The formulations of a photoactive compound may contain certain additives present in the photoresist prior to adding to polyamic acid, in amounts generally one (1%) percent or less of photoresist dry weight. Examples are anhydride for photoresist speed and adhesion enhancement as described in U.S. Pat. Nos. 4,009,033 and 4,036,644, as well as peroxides for speed enhancement as described in U.S. Pat. Nos. 4,259,430 and 4,089,766.

EXAMPLE

AZ1350J and polyamic acid were mixed together at room temperature in proportions such that the concentration of photoresist in the final mixture was approximately 5% on a weight-to-weight basis. Since the weight percentage of the photoactive compound in the photoresist is approximately 20%, the resulting concentration of photoactive compound in the final mixture was approximately 1% by weight. The photoresist/polyamic acid mixture was spun on a semiconductor wafer to a thickness of approximately 4 microns and then baked on a hot plate at a temperature between 90 and 100 degrees C. Following this first bake, the wafer was baked a second time at a temperature range between 150 and 270 degrees C. This second bake resulted in the conversion of polyamic acid to polyimide. Finally, a third bake in the range 270-350 degrees C. was used to insure full conversion of polyamic acid to polyimide. A layer of photoresist was then applied, baked and exposed as customarily done in the art and a mask pattern was developed in the photoresist. Metal was then deposited in a lift-off process.

The foregoing composition of insulation material works well with current ultraviolet, 365 to 505 nm. (and mid ultraviolet at 280 to 350 nm.) exposure tools. The material is a permanent layer for insulating the subsequent metallization layer from the prior metallization layer. The insulating layers 16, 17 may be patterned with photoresist having a pattern of holes. The holes may be etched with a poly-layer reactive ion etch. The holes so formed may provide interconnection between metal layers when a subsequent metallization layer is formed over the planarization layers 16, 17.

THEORY OF OPERATION

While the chemical phenomenon that occurs during the photoactive compound-polyamic acid conversion reaction has not been fully investigated, it is apparent that the changes in the index of refraction that have been observed are far greater than what would ordinarily be expected by the addition of the specified concentrations of photoresist, without any other reactions occurring. It is postulated that the photoactive compound reacts with the polyamic acid during the baking processes, resulting in a new and different chemical species having the index of refraction shown in FIG. 5, along with the insulating properties of polyimide and photoresist.

Although the foregoing process for providing a planarization layer which reduces boundary surface light scattering, and absorbs reflected light from under layers has been described in connection with an additive metal deposition process, the insulation composition may be utilized in other processes where it is necessary to reduce boundary scattering and under layer surface reflections from overexposing a photoresist layer.

Thus there is described a method and composition of matter useful for forming a planarization layer of insulation in a multilayer integrated circuit.

What is claimed is:

1. In a process for manufacturing integrated circuits, said circuits having a first layer of conductors supported on a substrate, a process for reducing scattered light from a polyimide/photoresist interface during the exposure of a photoresist layer with light in a process for defining a second layer of conductors comprising:

depositing a layer of polyamic acid on said first layer of conductors, said polyamic acid layer including a quantity of a positive photoresist;

said positive photoresist including a diazo-oxo napthalene photoactive compound selected from the group consisting of 2-diazo-1 oxo napthalene, 1-diazo-2 oxo-napthalene and acids or an ester thereof, the quantity of the photoresist selected to provide the polyimide layer with an index of refraction approaching that of the photoresist layer;

converting the polyamic acid to polyimide by successively heating to a first cure temperature in the range 90-110 degrees C., a second cure temperature in the range 150-250 degrees C., and a third cure temperature in the range 270-350 degrees C.;

applying a layer of photoresist containing a dizao-oxo napthalene photoactive compound selected from the group consisting of 2-diazo-1 oxo napthalene, 1-diazo-2 oxo napthalene and acids or an ester thereof, on said polyimide layer;

lithographically defining a pattern in said photoresist layer by exposure to light and subsequent development; and depositing the second layer of conductors through the pattern in the photoresist layer on said polyimide layer;

whereby the polyimide layer with photoresist will reduce the undesired scattered and reflected light due to its light absorptive properties and index of refraction approaching that of the photoresist layer.

* * * * *